United States Patent [19]
Begley et al.

[11] Patent Number: 5,648,678
[45] Date of Patent: Jul. 15, 1997

[54] PROGRAMMABLE ELEMENT IN BARRIER METAL DEVICE

[75] Inventors: Patrick A. Begley, W. Melbourne; John T. Gasner, Palm Bay; Lawrence G. Pearce, Palm Bay; Choong S. Rhee, Palm Bay; Jeanne M. McNamara, Palm Bay; John J. Hackenberg, Palm Bay; Donald F. Hemmenway, Melbourne, all of Fla.

[73] Assignee: Harris Corporation, Melbourne, Fla.

[21] Appl. No.: 310,280

[22] Filed: Sep. 21, 1994

[51] Int. Cl.⁶ .................................................. H01L 29/00
[52] U.S. Cl. ................ 257/529; 257/486; 257/530; 257/751; 257/767; 257/768; 257/926
[58] Field of Search .................. 257/50, 481, 529, 257/530, 603, 604, 605, 606, 751, 763, 768, 926, 486, 767; 365/105, 113

[56] References Cited

U.S. PATENT DOCUMENTS

| | | | |
|---|---|---|---|
| 4,312,046 | 1/1982 | Taylor | 365/104 |
| 4,569,120 | 2/1986 | Stacy et al. | 257/530 |
| 5,021,840 | 6/1991 | Morris | 257/476 |
| 5,270,265 | 12/1993 | Hemmenway et al. | 437/228 |
| 5,270,569 | 12/1993 | Beasom | 257/506 |
| 5,272,101 | 12/1993 | Forouhi et al. | 437/50 |
| 5,272,104 | 12/1993 | Schrantz et al. | 437/63 |
| 5,298,784 | 3/1994 | Gambino et al. | 257/530 |

FOREIGN PATENT DOCUMENTS

| | | |
|---|---|---|
| 0509631A1 | 10/1992 | European Pat. Off. . |
| 0562996A1 | 9/1993 | European Pat. Off. . |

*Primary Examiner*—Minh-Loan Tran
*Attorney, Agent, or Firm*—Nixon, Hargrave, Devans & Doyle LLP

[57] ABSTRACT

An integrated circuit 10 has a programmable Zener diode with diffusion regions 18 and 16 and metal contacts 34 and 32. A barrier metal 30 is disposed between one contact 32 and the substrate 12; another contact region 18 has no barrier metal on its surface. A polysilicon layer 22 is self-aligned with surface regions 18 and diffusion region 18. A silicide layer 128 may be used on the polysilicon layer 22 and on surface region 18.

19 Claims, 6 Drawing Sheets

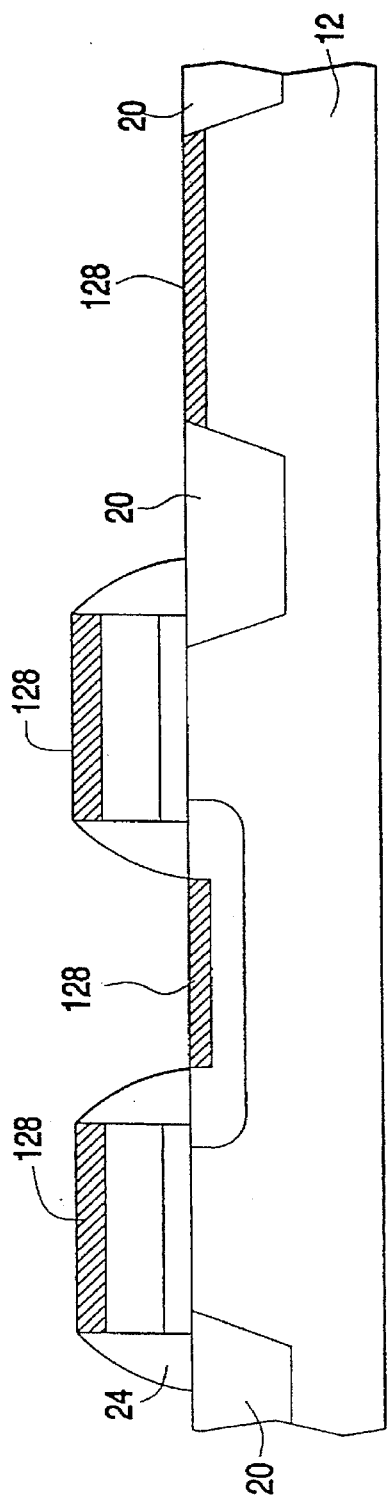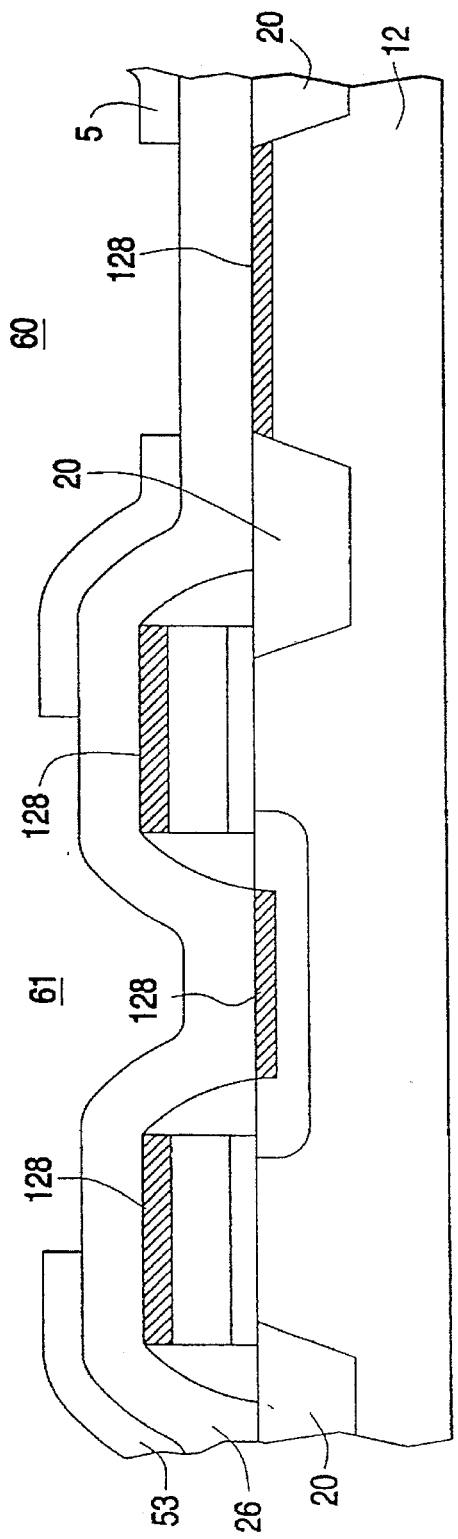

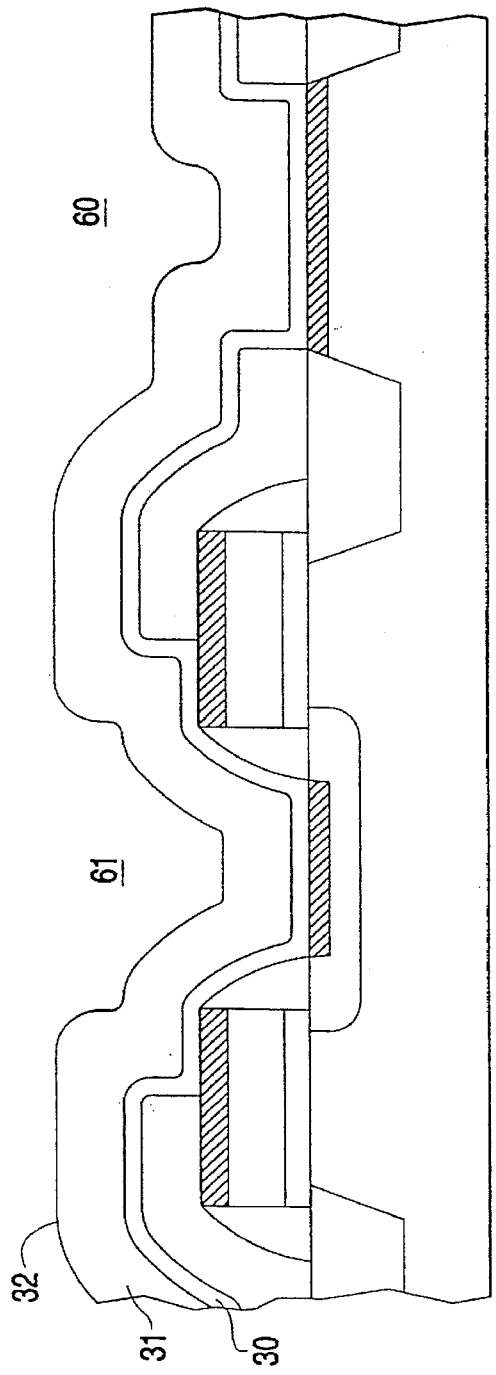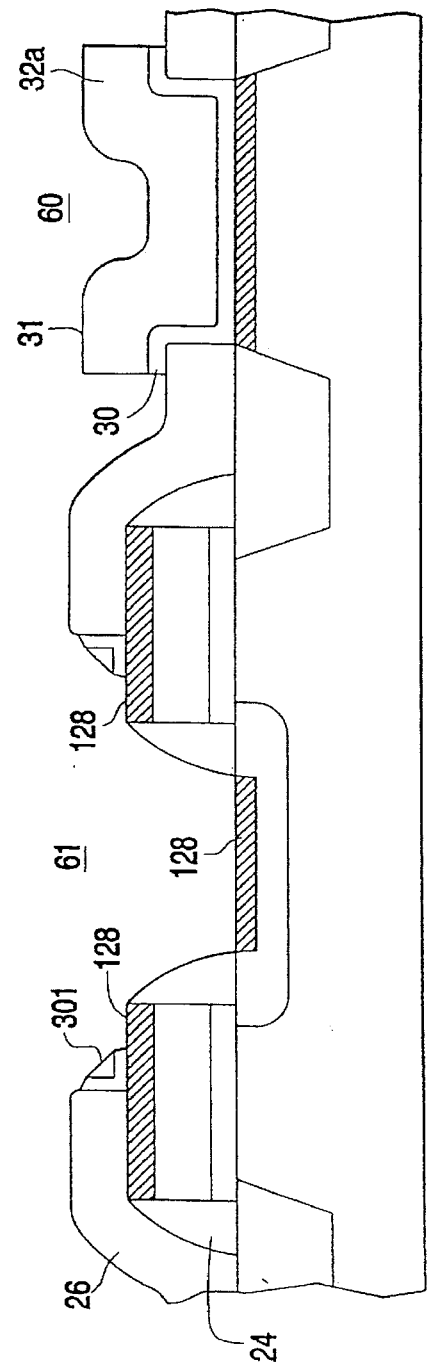

PROGRAMMABLE ELEMENT IN BARRIER METAL DEVICE

FIELD OF THE INVENTION

This invention relates in general to metallization systems, and, in particular, to a metallization system for an integrated circuit having a barrier metal.

BACKGROUND OF THE INVENTION

Conductive metal films provide interconnections between contacts of devices in an integrated circuit and between the circuit and the outside world. In a typical integrated circuit there is at least one layer of metal and often two or more layers of metal. While a number of metals are suitable for use in integrated circuits, aluminum is the metal most widely used for contacting devices and for interconnections of devices to the outside world. As such, a first level of metal, such as aluminum, provides ohmic contacts to surface contact regions of semiconductor devices. The ohmic contacts are separated from each other by one or more insulating regions. A second level of metal, also aluminum, provides an interconnection between one or more first level metal contacts and the outside world.

However, there are drawbacks to contacting a semiconductor surface with aluminum. One problem is the solubility of silicon in aluminum. Silicon tends to diffuse into aluminum. Over time the aluminum-silicon interface degrades, aluminum penetrates below the aluminum-silicon interface which may lead to junction failure. Another problem is metal migration. Under the application of voltage and current, the metal on the silicon migrates or pushes its way into the silicon. Such metal migration is accelerated by high voltages and high currents. If the metal migration is enough, the metal passes through a surface contact region to a deeper region where the metal will short out a junction between the two regions in the body of the device.

Many of the problems posed by metal migration and diffusion are solved by the use of a barrier metal layer between the silicon and the deposited aluminum. A typical barrier layer metal is titanium tungsten (TiW). TiW acts as an adhesive layer and adheres to both silicon and aluminum. In addition, it has the property of preventing the migration or diffusion of aluminum into silicon. Such barrier metal layers are widely used in integrated circuits. Other barrier metals include, but are not limited to, TIN,& Ti.

Certain integrated circuits also take advantage of the metal migration properties of aluminum deposited on silicon. Such devices are typically programmable devices and are typically diodes with Zener diodes being the preferred choice. The Zener diode, under normal biasing conditions, is back biased and appears to be an open circuit. During programming, the Zener is subjected to high currents and high voltages, resulting in Joule heating, which cause one of its aluminum contacts to a Zener surface region to migrate through the junction of the Zener diode and effectively short out the diode. Thus, with such metal migration programmable Zener diodes, a user has the opportunity to provide a programmable device. A Zener diode, in its initial state and back biased will appear as an open circuit. A Zener diode programmed and shorted out by metal migration will appear as a short circuit or at least a very low resistance path as compared to a back biased Zener diode.

However, when devices that rely upon metal migration programmable Zener diodes are provided with barrier metal layers, the Zener diodes lose their programmability since the barrier layer metal prevents the metal migration of aluminum into silicon and thereby prevents the programming of Zener type programmable devices.

Programmable Zener diodes are often used in application specific integrated circuits (ASIC). Such circuits may be individually designed for a particular application. Alternatively, ASICs are often constructed from a number of so-called cells. Each cell represents a design of one circuit that is compatible in operation and manufacture with other circuits or cells. Together the cells form a library of modular circuit designs available for creating an ASIC. In ASICs, it is often desirable to combine predetermined integrated circuit cells with individually programmable cells where such programmable cells are programmable by the user or programmable at the end of the manufacturing process. In the manufacture of such ASICs, barrier metals are now widely used in order to prevent aluminum from penetrating into the surface of the silicon. However, the presence of the barrier metal interferes with those ASICs that rely upon programmable Zener diodes.

It is an object of this invention to provide a programmable device in an integrated circuit with a barrier metal system.

It is also an object of this invention to provide a method and apparatus for programming a Zener diode in an integrated circuit having a barrier metal system.

SUMMARY OF THE INVENTION

The invention provides an integrated circuit having one or more programmable devices such as programmable Zener diodes. The integrated circuit of the invention is formed on a substrate of semiconductor material. The substrate has a surface and in that surface a programmable device is formed, preferably a programmable Zener diode. The programmable device has first and second surface contact regions for receiving first and second level metal contacts. A first thin oxide layer is grown or deposited on the substrate. A layer of polysilicon is deposited on the first thin oxide to form gates and define the Zener diffusion. A field oxide separates adjacent devices. A second oxide layer is deposited over the surface of the polysilicon material. The second oxide layer is etched or patterned to expose over the polysilicon and the first and second surface contact regions in the semiconductor material for the purpose of defining regions to be silicided and to provide sidewall oxide spaces. A third oxide layer is deposited and patterned to establish apertures for a first level metal. The apertures are filled with a first level of metal. The first level of metal includes a barrier metal layer. A layer of metal, e.g., aluminum, is deposited on the barrier layer. In the preferred embodiment, the barrier metal layer is typically TiW. The first level of metal is patterned and etched to remove it from selective second contact surface regions of the semiconductor that form one of the terminals of the Zener diode. The first level metal is masked and the metal is removed so that the metal deposited in the second aperture is mostly removed or is at least removed from the contact surface area of the second contact surface region. A fourth oxide layer is then provided to insulate the first level metal contacts from a second metal layer. The fourth oxide layer is patterned to open an aperture above the second surface contact region. A second level of metal is uniformly deposited and suitably patterned to provide aluminum in the second aperture region. By virtue of the contours of the third and fourth oxide layers, the aluminum deposited in the second aperture has a step-like configuration down to the surface of the silicon. In order to program the Zener and establish a short circuit, the second metal contact layer is subjected to a relatively high voltage and high current so that the aluminum in the second contact is forced into the silicon surface and past the junction of the Zener diode.

It is another feature of the invention that the second surface contact region has a layer of polysilicon that overlaps the junction of the Zener diode at the surface of the silicon. The layer of polysilicon is etched to provide an opening to a second contact region of the Zener diode that is formed on the surface of the silicon material. The polysilicon layer and the silicon surface exposed between ends of the polysilicon layer may be silicided, preferably with platinum. As such, the platinum silicide on the polysilicon and silicon layers can act as an etch stop when the first level of metal is removed from the second aperture. It will also act as an etch stop for the third and fourth oxide layers. The silicide layer may receive the second level of metal because aluminum can migrate through silicides. The second level of metal is deposited over the surface and in the second apertures that include the second surface contact region of the Zener diode as well as a portion of the junction of opposite conductivity. Thus, when the aluminum penetrates into the Zener, it will penetrate only into one terminal of the Zener diode, but not through the polysilicon layer and into the other conductivity region of the diode.

The use of polysilicon in the structure allows the size of the diode to be built small. This allows for a greater current density making the diode easier to program. Additionally, without the use of the polysilicon, there would normally exist a metal stringer from the first metal etch. This stringer could supply a current shunt that is incapable of junction spiking, because the current would flow through the first metal barrier layer. In addition, the stringer, being not well controlled, could cause the programing area to vary.

DESCRIPTION OF THE DRAWINGS

FIGS. 2(a)–(j) show a series of sequential steps for forming conductive and insulating layers on top of the substrate in order to provide the device shown in FIG. 1.

DETAILED DESCRIPTION

Figure 1:
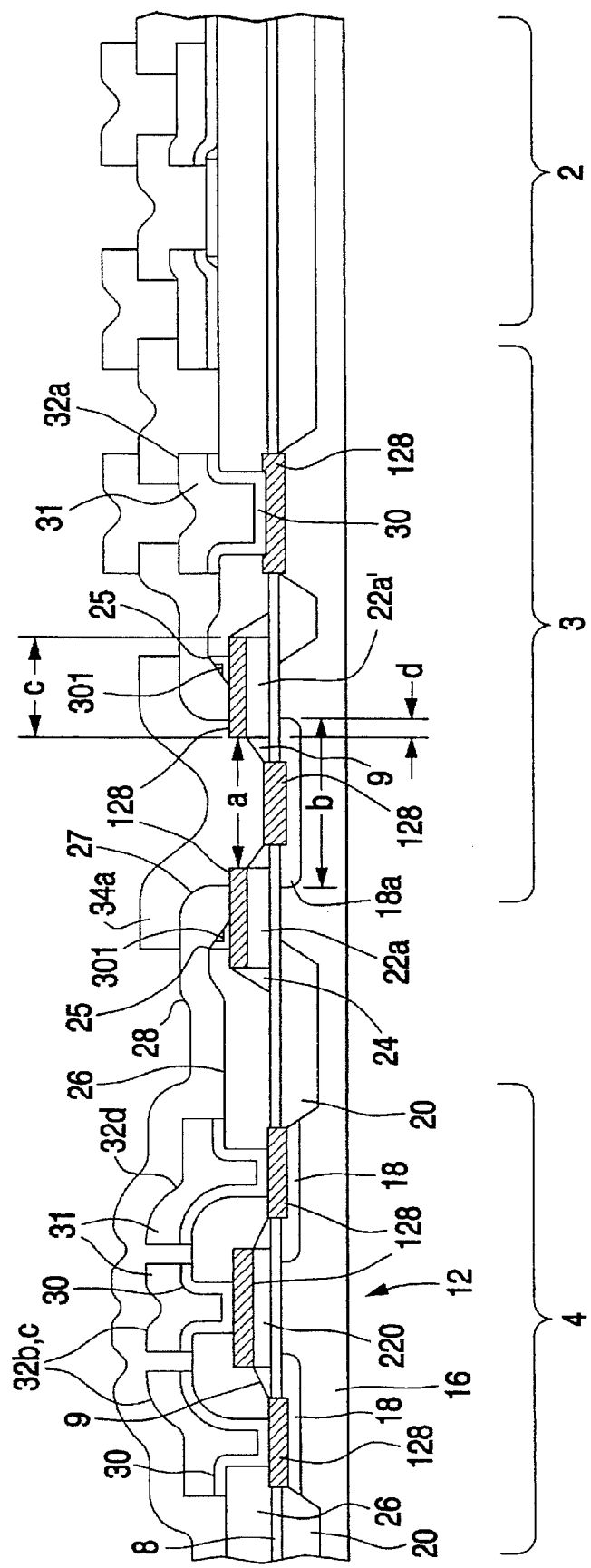
FIG. 1 is a cross sectional area of an integrated circuit with a programmable diode.

With reference to FIG. 1, there is generally shown an integrated circuit 10 with a transistor 4, resistor 2, and a diode 3 constructed on a substrate of monocrystalline silicon 12. The n-type substrate 12 has a p-type layer 16. Within the layer 16 are highly doped n-type regions 18. Thus, the p-n type diode 3 having a highly doped n-type region 18a surrounded by the p-type layer 16 is formed in the integrated circuit 10. The diode has first and second metal contact terminals 32a, 34a, respectively.

A thick field oxide layer 20 separates the device 3, 4 of FIG. 1 from each other and from adjacent devices. The first level metal contact layer 32 has an aluminum layer 31 in mechanical and electrical contact with a conductive barrier layer 30 that is also in mechanical and electrical contact with an optional silicide layer 128 that is also in mechanical and electrical contact with the upper surface of the monosilicon substrate 12 and in contact with the p layer 16. First level metal layer 32 provides contacts 32a, 32b, 32c ... 32n. The barrier layer 30 is typically comprised of a barrier metal material such as titanium tungsten (TiW). Other barrier metals may include, but are not limited to TiN and Ti. The substrate 12 has a thin, first oxide layer 8. On first oxide 8 there is a polysilicon layer 22. The polysilicon layer 22 is patterned to define apertures for the diode 3 and the gate 22b of the transistor 4. The polysilicon layer 22 in the region of diode 3 has an opening a. The opening a is less than the width of the n+ diffusion region 18a, whose width is b. The opening a in polysilicon layer 22 defines the diffusion region 18a of diode 3. Each polysilicon layer portion 22a, 22a' has a width c which overlaps portions d of the n+ region 18a. The remainders of the polysilicon layer portions 22a, 22a' are disposed over the p− region 16, and oxide 20.

Above the polysilicon layer 22 is a second oxide layer 24. Oxide layer 24 is opened to silicide the polysilicon and the substrate. Oxide spacers 9 enclose the sidewalls of the patterned polysilicon 22a, 22a'. A third oxide layer 26 has sidewalls 25 that initially define a first level metal aperture opening. Adjacent to sidewalls 25 are residual portions 301 (stringers) of the first metal layer. First metal layer 32 provides contacts 32a, 32b, ... 32n. A fourth oxide layer 28 is disposed over the residual portions 301 of the first metal layer and the third oxide layer 26 and metal contacts 32n. The fourth oxide layer 28 extends partially over the polysilicon layer 22. Thus, the final second aperture for metal contacts 34n is defined by sidewalls 27 in the fourth oxide 28. The sidewalls 27 together with the polysilicon 22 define a stepped aperture to receive the second level metal 34, which is preferably aluminum. The second level metal 34 fills the aperture defined by sidewalls 27 and contacts the surface of the substrate 12 in the center of the region defined by n+ diffusion 18. A silicide layer 128 is provided on top of the polysilicon layer 22 and portions of surface 12. Silicide layer 128 will allow the migration of the second metal contact 34 into the silicon 12.

Thus, as shown in FIG. 1, a diode 3 is defined by a first metal contact 32a, a p region 16, an n region 18a, and a second metal contact 34a. In its normal state as shown in FIG. 1, if the diode 3 is back biased, it appears to be an open circuit in the integrated circuit 10. However, when the diode 3 is programmed it appears to be a short circuit or at least a very low resistive path. Programming is accomplished by passing a relatively high current in the order of 100 milliamps at a relatively high voltage on the order of 10 volts through the second metal contact 34a. Upon doing this, the large current passing through second metal contact 34a and the pn junction formed by regions 16 and 18a, causes the aluminum metal from the contact 34a to migrate into the n region 18a and beyond the pn junction into the p region 16. Once the metal of contact 34a enters the p region 16, the diode is effectively short circuited.

It will be noted that the polysilicon layer 22 extends over a portion of the n region 18a as well as a portion of the p region 16. In addition, the aperture in fourth oxide 28 is formed to receive metal contact 34a and is wider than the opening a in polysilicon layer 22. However, the opening a in the polysilicon layer 22 is less than the width b of the n+ region 18. With such topology, the shape of the metal contact 34 is generally reduced in diameter as the metal 34 nears the surface 12 of the silicon.

Figure 2A:
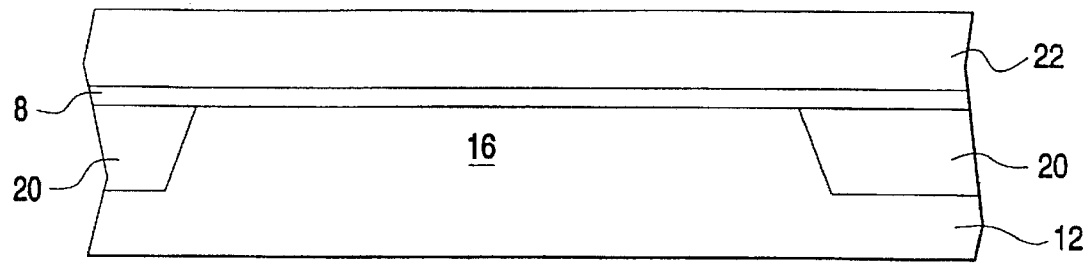
Figure 2B:
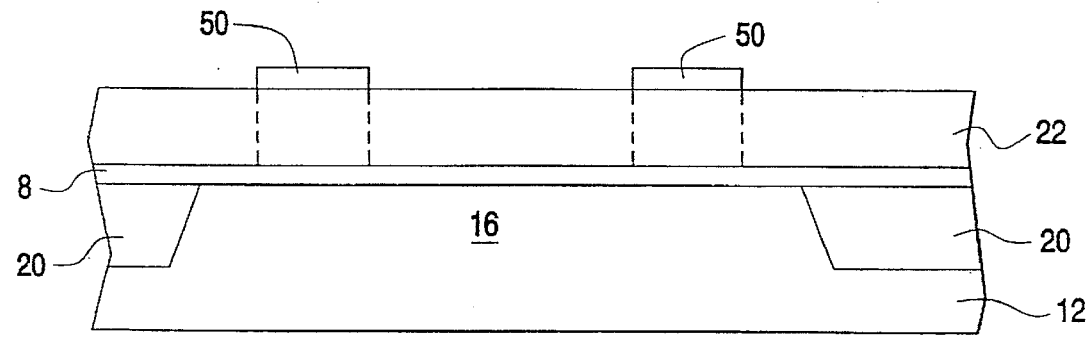
Figure 2C:
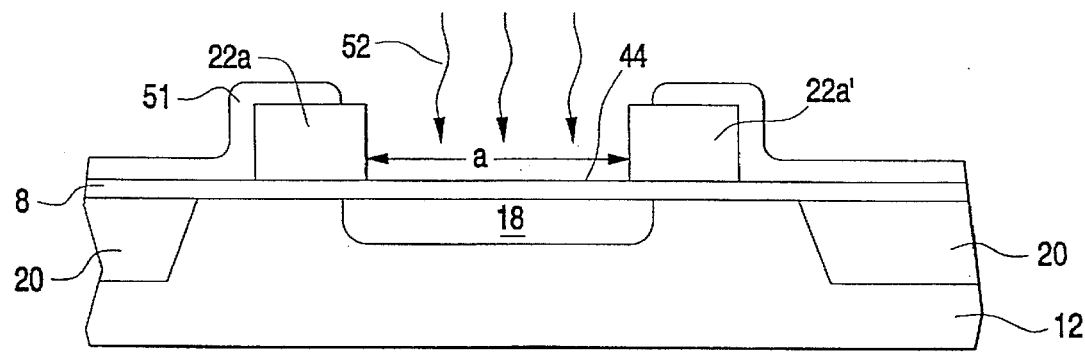
Figure 2D:
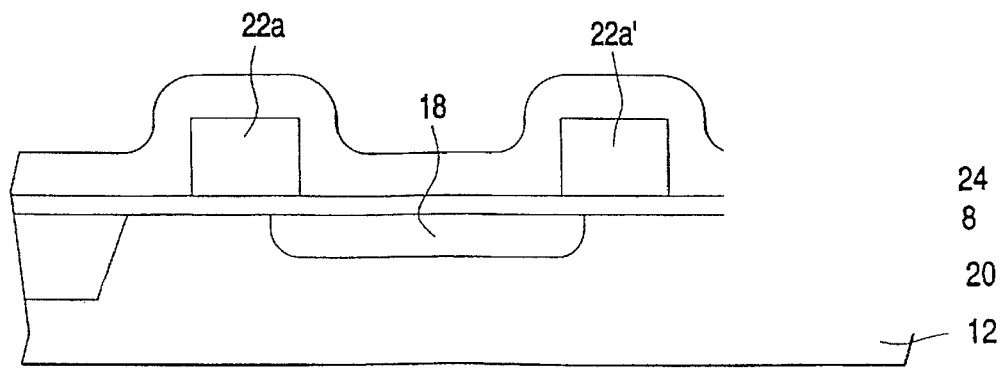

Turning now to FIGS. 2(a)–(j), there is shown a series of sequential steps in which the programmable diode 3 shown in FIG. 1 is formed. In FIG. 2(a) the substrate 12 is a n single crystal silicon substrate with a p-type surface region 16. Thick oxide regions 20 separate adjacent device regions. On top of the substrate 12 a thin, first oxide layer 8 is formed upon which an n-doped polysilicon layer 22 is uniformly deposited. Above the polysilicon layer, a layer of photoresist 50 is uniformly deposited and patterned to define the polysilicon 22 layer in FIG. 2(b). The areas of the polysilicon layer 22 not covered by photoresist 50 are suitably etched to the thin oxide layer 8 and provide the intermediate structure shown in FIG. 2(c). As such, polysilicon layer 22 is patterned to define a surface contact region 44 on the surface of substrate 12. At this time, the n region 18 is implanted (see arrows) or diffused via an implant or diffusion 52 into the surface of the substrate 12 using masking layer 51. As such, the polysilicon layer 22 is self-aligned with the n region 18. The spacing a between the polysilicon strips 22a, 22a' defines the n region 18 which subsequently diffuses laterally. Thereafter the masking layer 51 is removed and a conformal second layer 24 of silicon dioxide is deposited as shown in FIG. 2(d).

Next, the second silicon dioxide layer 24 and portions of layer 8 are etched to expose the surface of poly layer 22 and the surface of substrate 12. The polysilicon 22 and the substrate 12 are silicided to provide a silicide layer 128 as shown in FIG. 2(e).

As shown in FIG. 2(f), a third silicon dioxide layer 26 is deposited and coated with photoresist 53 which is patterned to define first and second contact apertures 60, 61, respectively. The third oxide layer 26 is suitably patterned and etched to expose the silicided surface 128 of polysilicon 22 and of the silicon in the regions of the first and second apertures 60, 61, respectively.

As next shown in FIG. 2(g), a first metal layer 32 with barrier layer 30 and metal layer 31 is deposited over the surface of the substrate 12, patterned and etched, as shown in FIG. 2(h) to provide the first metal contact 32a in the first aperture 60. The metal layer 31 is aluminum and the etch stops on the barrier layer 30. The barrier layer is etched, stopping on the silicide 128. The second aperture 61 has the first metal 32 removed except for metal stringers 301. Stringers 301 remain because it is difficult to remove residual first metal layer 32 without significant overetch in second aperture 61. Overetch of layer 32 is undesirable and the presence of stringers 301 is not detrimental to the process or the diode 3 since stringers 301 are laterally displaced from the active programming area. This is an advantage of using polysilicon 22 as part of the diode 3 structure.

Figure 2I:
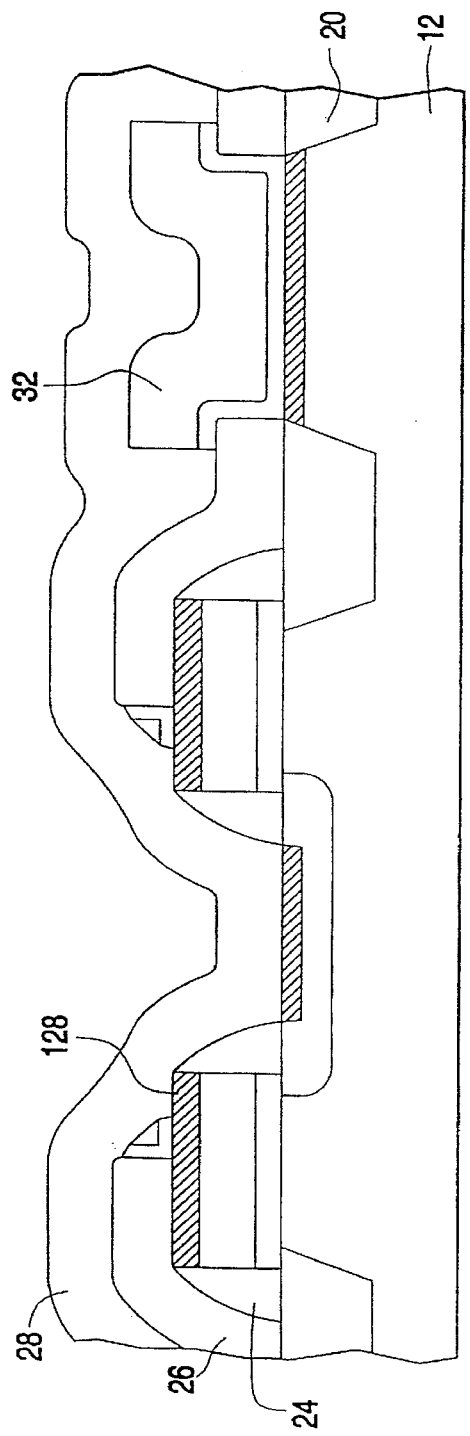
Figure 2J:
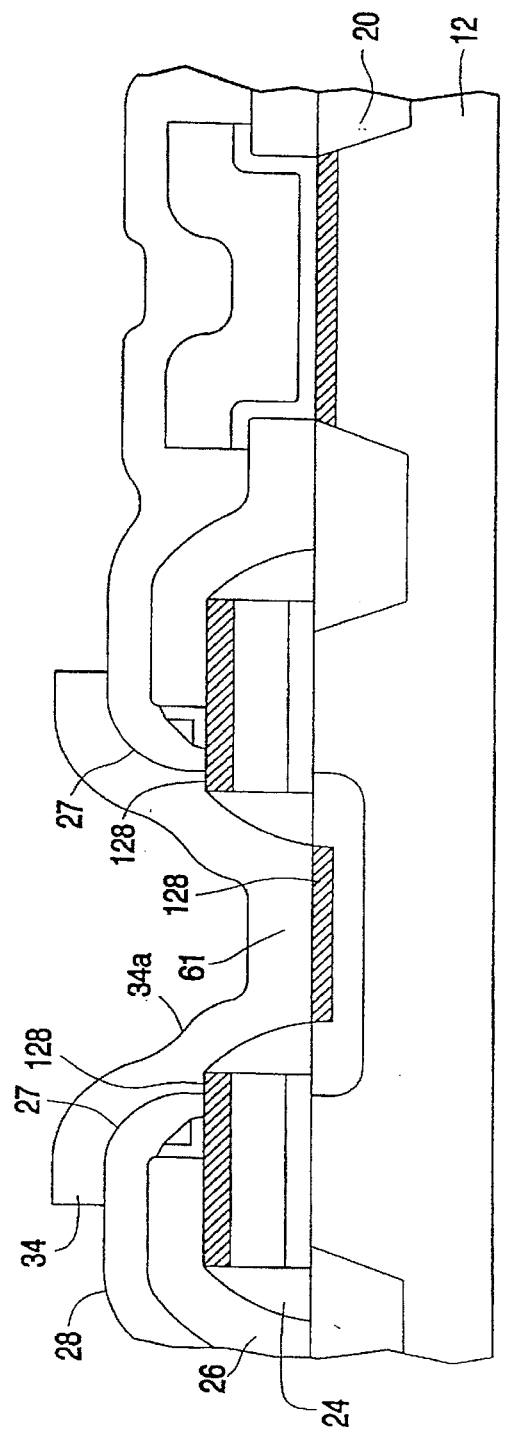

Next, a fourth oxide layer 28 is deposited over the substrate 12 in order to isolate the first metal layer 32 from the rest of the circuit. This step is shown in FIG. 2(i). The layer 28 is then suitably patterned and etched to stop on the silicide 128 and to open the second aperture 61, as shown in FIG. 2(j). A second level metal 34, typically aluminum, is uniformly deposited over the entire surface of the substrate and second level metal layer 34 is then patterned to form second level metal contacts 34a, 34b . . . 34n. The second level metal 34 is etched to stop on fourth level oxide 28.

Figure 3:
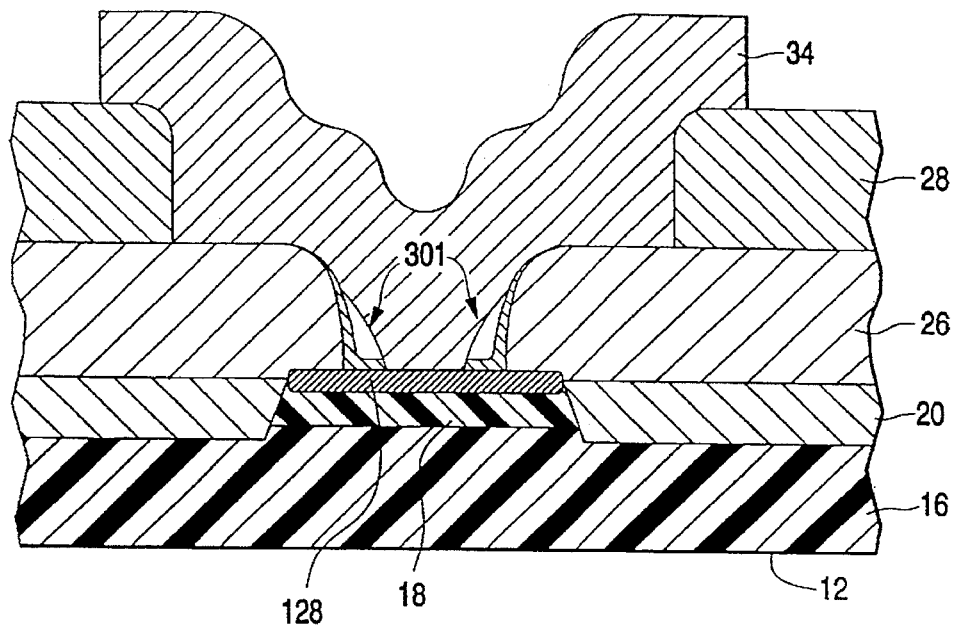
FIG. 3 is a cross section of a second embodiment of the invention.

An alternate structure and process is illustrated in FIG. 3. There, the layer of polysilicon 22 is absent and the first level metal stringers 301 contact the silicide areas 128 and adhere to the adjacent oxide 26. Alternately, the silicide 128 can be removed. With such a structure, the process is simpler since the polysilicon layer 22 is omitted. However, the stringers 301 give the resulting diode 3 a wider programming voltage variation.

It is contemplated that the programmable diode described above can be used in combination with other circuits especially in ASICs. It is common to fabricate ASICs by using a number of predetermined individual circuits. These predetermined individual circuits have been designed to work with each other. In general the designs for such circuits are stored in a memory or data base of a design computer and are often referred to as cells. With these cells, an ASIC designer can pick or choose from one or more circuits and combine them with suitable computer design tools. What this invention provides is a method for using a familiar programmable diode in combination with a new ASIC process that employs a barrier metal. In this way, the ASICS produced with the invention can have one or more programmable diodes in combination with the other ASIC cells that include AND gates, OR gates, flip-flops, A-to-D converters, amplifiers, and still other circuits known to those skilled in the art.

Figure 4:
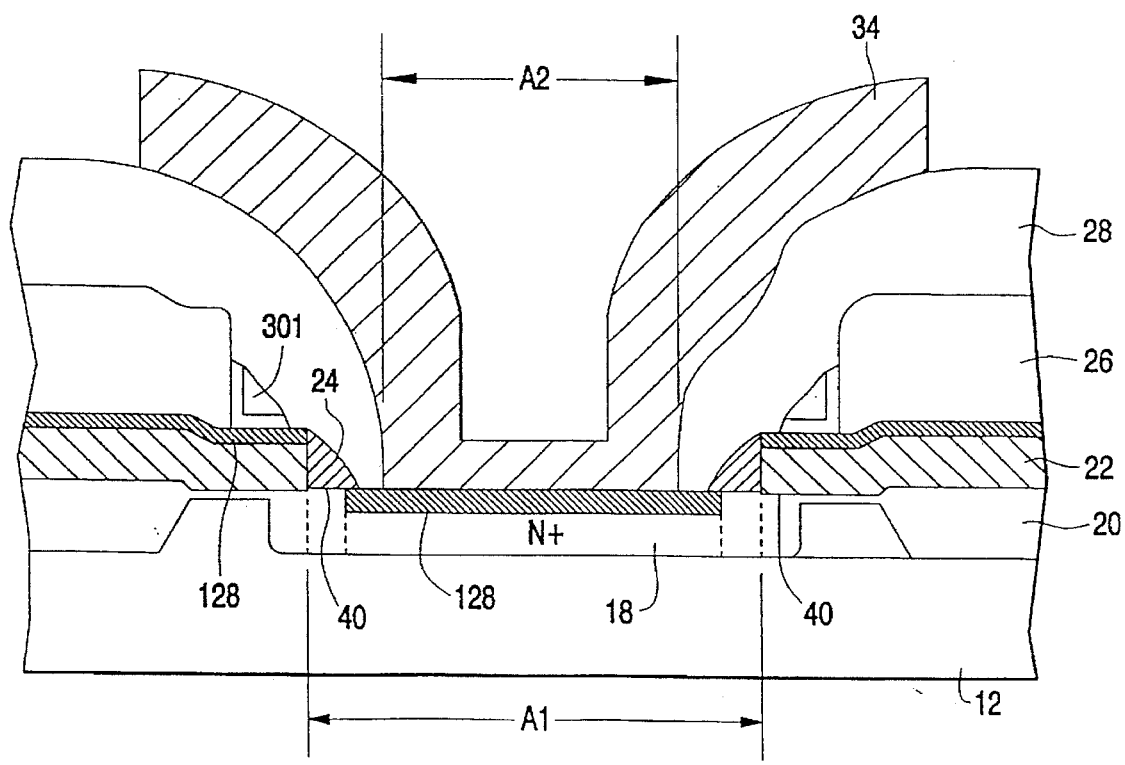
FIG. 4 is a cross section of a third embodiment of the invention.

Turning to FIG. 4, a third embodiment of the invention is shown. There the opening A1 in polysilicon layer 22 is enlarged so that opening A2 in the fourth oxide layer 28 can accommodate the second level metal layer 34. As such the second level metal layer 34 is nested within the opening A1 of polysilicon layer 22. In addition, the polysilicon layer 22 is electrically isolated from second level metal layer 34 by the fourth oxide layer 28. The tiered structure shown in FIG. 4 for layer 34 provides good step coverage so long as opening A2 is large enough. Since sidewall spacer oxide 24 is thin, it may be etched away during earlier oxide etch steps, e.g. during the etching of third oxide layer 26.

The structure of FIG. 4 also protects the non-silicided surface areas 40 of the substrate 12. The areas 40, located between the edges of the polysilicon layer 22 and the silicide surface 128, have a low selectivity to an oxide etch. If sidewall spacer 24 is removed by an earlier oxide etch, an overetch of fourth oxide layer 28 could damage the junction 18 in the areas 40. Damage to areas 40 may result in excessive diode leakage. However, the opening A1 in polysilicon layer 22 is large enough to accept a fourth oxide layer 28 that is thick enough to protect areas 40.

Having thus described the preferred embodiments of the invention, those skilled in the art will realize that further modifications, additions, deletions and changes thereto can be made without departing from the spirit and scope of the invention as set forth in the following claims. Other dielectric layers, e.g., silicon nitride, diamond, may be substituted for one or more of the oxide layers.

What is claimed is:

1. An integrated circuit comprising:

a substrate of semiconductor material having a surface with a programmable device formed in said surface, said programmable device having first and second surface contact regions in the surface of the substrate and spaced from each other for receiving metal contacts;

a first layer of dielectric insulation over said surface;

a first aperture in said first dielectric layer, said first aperture aligned with said first surface contact region;

a first metal contact having a barrier layer disposed in said first aperture and contacting said first surface contact region;

a second dielectric layer over said device and said first metal contact;

a second aperture extending through said first and second dielectric layers and aligned with said second surface contact region;

a second, migratory metal contact in said second aperture, the metal of said second metal contact in direct contact with said semiconductor substrate for migrating into said surface of said semiconductor substrate and through said programmable device when a predetermined current passes through said two metal contacts and said programmable device.

2. The integrated circuit of claim 1 further comprising a first layer of semiconductor material on said surface over said second contact region, said first layer of semiconductor material having a third aperture therein aligned with said second contact region.

3. The integrated circuit of claim 2 wherein said semiconductor material is silicon.

4. The integrated circuit of claim 3 wherein said first layer of semiconductor material further comprises a silicide.

5. The integrated circuit of claim 2 wherein said third aperture is smaller than said second aperture.

6. The integrated circuit of claim 1 wherein the first surface contact region has a first type of conductivity and the second surface contact region has a second type of conductivity, said types of conductivity being opposite each other.

7. The integrated circuit of claim 6 wherein the programmable device is a diode.

8. The integrated circuit of claim 7 wherein the diode is a Zener diode.

9. An integrated circuit comprising:
a silicon substrate material having a surface with a programmable Zener diode device formed in said surface, said Zener diode having first and second surface contact regions in the surface of the semiconductor and spaced apart from each other for receiving metal contacts, said first and second surface contact regions having first and second dopings, respectively, of opposite conductivity;
a first layer of silicon dioxide over said surface;
a first aperture in said first silicon dioxide layer, said first aperture aligned with said first surface contact region;
a first metal contact having a barrier layer disposed in said first aperture and contacting said first surface contact region;
a second layer of silicon dioxide over said Zener diode and over said first metal contact;
a second aperture extending through said first and second silicon dioxide layers and aligned with said second surface contact region;
a second metal contact in said second aperture, the metal of said second metal contact migrating into said surface of said silicon substrate and through said programmable device at said second surface contact region when a predetermined current passes through said two metal contacts and said Zener diode.

10. The Zener diode of claim 9 further comprising a first layer of polysilicon material on said surface over said second contact region, said polysilicon layer having a third aperture therein aligned with said second contact region.

11. The Zener diode of claim 10 wherein the polysilicon layer is silicided.

12. The Zener diode of claim 11 wherein the polysilicon layer is silicided with platinum.

13. A programmable diode comprising:
a semiconductor substrate having first and second diode surface contact regions in the surface of the semiconductor substrate and spaced apart from each other;
a first insulating layer over the contact regions with respective first and second apertures in said first insulating layer, said first and second apertures aligned with said first and second contact regions respectively;
a barrier metal disposed in said first aperture for electrically contacting said first surface contact region and a migratory metal disposed in said second aperture for electrically contacting said second surface contact region;
a first layer of polysilicon material on said surface over said second contact region, said polysilicon layer having a third aperture therein aligned with said second contact region.

14. The diode of claim 13 wherein the second surface contact region comprises a silicide.

15. The diode of claim 13 wherein the polysilicon layer comprises a silicide.

16. The diode of claim 13 wherein a second insulating layer is disposed over the polysilicon aperture and having a third aperture in said second insulating layer self aligned with the second contact region.

17. The diode of claim 16 wherein the third aperture in the second insulating layer is nested inside the polysilicon aperture.

18. The diode of claim 16 wherein the second insulating layer covers sidewalls of the polysilicon aperture.

19. The diode of claim 18 wherein a central portion of the second surface contact region is silicided, a first region of the substrate surface surrounding the central region is covered by the second insulating and a second region of the substrate surface surrounding the first region is covered by the polysilicon layer.

* * * * *